United States Patent
Cok et al.

(10) Patent No.: US 8,022,612 B2
(45) Date of Patent: Sep. 20, 2011

(54) WHITE-LIGHT LED HAVING TWO OR MORE COMMONLY CONTROLLED PORTIONS WITH IMPROVED ANGULAR COLOR PERFORMANCE

(75) Inventors: Ronald S. Cok, Rochester, NY (US); Joel D. Shore, Rochester, NY (US)

(73) Assignee: Global OLED Technology, LLC., Wilmington, DE (US)

( * ) Notice: Subject to any disclaimer, the term of this patent is extended or adjusted under 35 U.S.C. 154(b) by 417 days.

(21) Appl. No.: 12/267,760

(22) Filed: Nov. 10, 2008

(65) Prior Publication Data

US 2010/0117517 A1 May 13, 2010

(51) Int. Cl.
*H01L 51/50* (2006.01)
(52) U.S. Cl. ........................................ 313/503
(58) Field of Classification Search .................. None
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,554,911 A | 9/1996 | Nakayama et al. | |
| 5,949,187 A | 9/1999 | Xu et al. | |
| 6,384,529 B2 | 5/2002 | Tang et al. | |
| 6,680,570 B2 | 1/2004 | Roitman et al. | |
| 6,861,800 B2 | 3/2005 | Tyan et al. | |
| 6,919,681 B2 | 7/2005 | Cok et al. | |
| 6,987,355 B2 | 1/2006 | Cok | |
| 7,030,553 B2 | 4/2006 | Winters et al. | |
| 7,129,634 B2 * | 10/2006 | Boroson et al. | 313/504 |
| 7,180,238 B2 | 2/2007 | Winters | |
| 7,268,485 B2 | 9/2007 | Tyan et al. | |
| 7,271,537 B2 * | 9/2007 | Matsuda et al. | 313/506 |
| 7,615,800 B2 | 11/2009 | Kahen | |
| 2006/0066228 A1 | 3/2006 | Antoniadis et al. | |
| 2007/0057263 A1 | 3/2007 | Kahen | |
| 2007/0286944 A1 * | 12/2007 | Yokoyama et al. | 427/66 |

* cited by examiner

*Primary Examiner* — Toan Ton
*Assistant Examiner* — Britt Hanley
(74) *Attorney, Agent, or Firm* — McKenna Long & Aldridge, LLP.

(57) ABSTRACT

A light-emitting diode device, includes a substrate; and a light-emitting element having two or more commonly-controlled portions, the light-emitting element having two electrodes and a common unpatterned white-light-emitting layer formed between the two electrodes, at least one portion having an optical spacer, each portion having a different optical structure, the optical structure in one portion being tuned to emit substantially white light and that one portion having a transparent electrode, and the optical structure in a different portion being tuned to emit colored light.

19 Claims, 6 Drawing Sheets

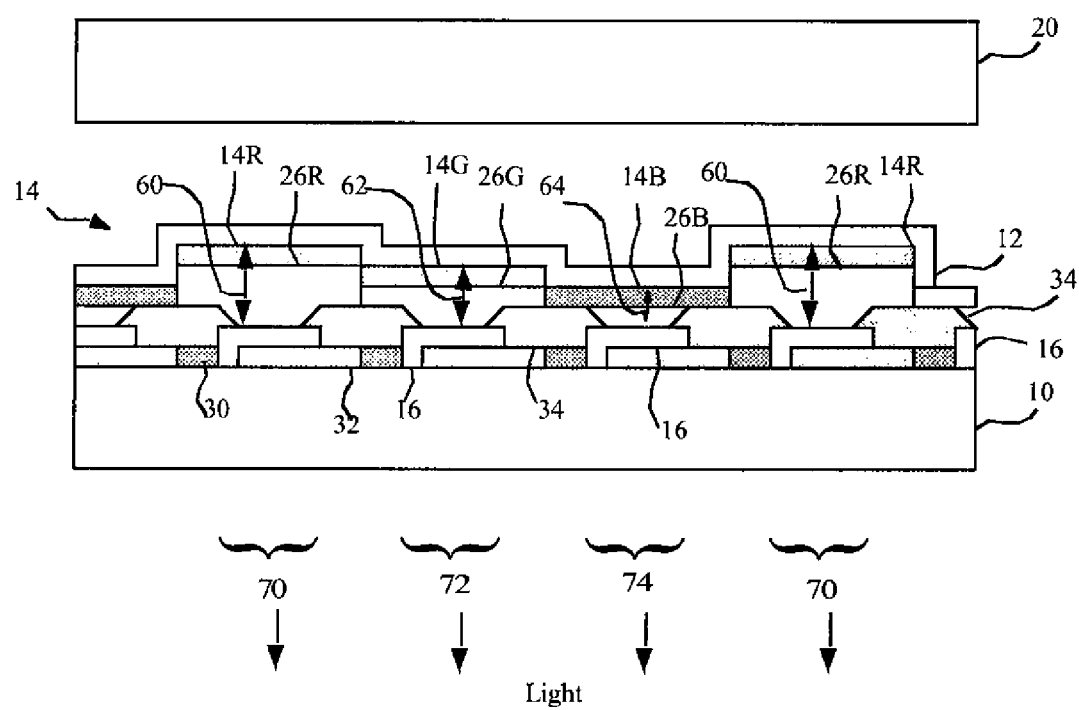
FIG. 9 - Prior Art

WHITE-LIGHT LED HAVING TWO OR MORE COMMONLY CONTROLLED PORTIONS WITH IMPROVED ANGULAR COLOR PERFORMANCE

FIELD OF THE INVENTION

The present invention relates to light-emitting diode (LED) devices that emit white and colored light.

BACKGROUND OF THE INVENTION

Emissive flat-panel display devices are widely used in conjunction with computing devices and, in particular, with portable devices. These displays are often used in public areas with significant ambient illumination and are viewed from a wide variety of angles. Such devices are also under development as area illumination devices or lamps.

Light emitting diodes (LED) incorporating thin films of light-emitting materials have many advantages in a flat-panel display device and are useful in optical systems. Such films can comprise either, or both, organic and inorganic materials. U.S. Pat. No. 6,384,529 issued May 7, 2002 to Tang et al. shows an OLED color display that includes an array of OLED light-emitting elements (sub-pixels). Light is emitted from a sub-pixel when a current is passed through an organic material, the frequency of the light depends upon the nature of the organic material that is used. The organic materials are placed upon a substrate, between electrodes, with an encapsulating cover layer or plate. In such a display, light can be emitted through the substrate (a bottom emitter), or through the encapsulating cover (a top emitter), or both. The emitted light is usually approximately Lambertian, that is, the brightness of the device is independent of the viewing angle. Because LED devices employ high-optical-index emissive materials, a large fraction (e.g. greater than 50%) of the emitted light is trapped in the device due to total internal reflection and thus reduces the device efficiency. Inorganic materials, for example, may include phosphorescent crystals or quantum dots. Other thin films of organic or inorganic materials may also be employed to control charge injection, charge transport, or charge blocking to the light-emitting-thin-film materials, and are known in the art.

Optical cavity structures are known to affect the light emitted from an LED device. When a pronounced optical effect is seen and when formed in thin films with at least one semi-transparent or semi-reflective layer, such optical cavity structures are known as microcavities or optical microcavities. However, in any LED device employing transmissive and reflective electrodes with an emitting layer formed between the electrodes that emit light into air, an optical cavity structure producing optical interference effects will be present. The optical cavity will have an optical cavity length that can include the electrodes. An optical cavity length between two electrodes is the sum of the thickness times the refractive index of the layers between the two electrodes.

When formed in LED devices, different color light-emitting organic materials are pattern-wise deposited over a substrate between a reflective electrode and a semi-transparent electrode, for example a thin silver electrode. Optical microcavities are tuned to a desired peak wavelength of light, typically corresponding to the color of light emitted by the patterned light-emitting materials. U.S. Pat. No. 6,680,570 by Roitman et al. describes an organic light-emitting device with improved color control employing spacer layers to form an optical cavity. FIG. 9 illustrates such a prior-art, active-matrix, bottom-emitting optical microcavity device employing a substrate 10 with active-matrix thin-film components 30, planarization structures 32 and 34, and a semitransparent electrode 16. Patterned organic materials 14R, 14G, and 14B providing red, green, and blue light emission are deposited in a light-emitting layer(s) 14 with a reflective electrode 12 formed over the light-emitting layer(s) 14. Optical spacers 26R, 26G, and 26B are employed to form optical cavities 60, 62, and 64 tuned to the desired peak wavelengths of red, green, and blue light, respectively to emit red light 70, green light 72, and blue light 74. A cover 20 can be employed to protect and encapsulate the device.

While such designs are useful, they require a patterned organic-material deposition technology (for example, vacuum deposition through metal shadow-masks) that is difficult to scale to large substrates. Moreover, optical-microcavity devices typically suffer from unacceptable angular color dependence. It is also known to employ a color filter with an optical cavity structure, for example as taught in U.S. Pat. No. 7,180,238 by Winters. However, while useful, such an approach does not improve the manufacturability of the device and provides inadequate ambient contrast ratio under some illumination conditions. Moreover, the color filters absorb light emitted from the light-emitting layer, thereby reducing device efficiency.

U.S. Pat. No. 5,554,911 entitled "LIGHT-EMITTING ELEMENTS" by Nakayama et al. describes a multi-color light-emitting element having at least two optical cavity structures with respectively different optical lengths determining their emission wavelengths. Each optical cavity structure includes an organic material as a light-emitting region, which may be a single film of uniform thickness in the element. U.S. Pat. No. 6,861,800 entitled, "TUNED MICROCAVITY COLOR OLED DISPLAY" by Tyan et al. describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a separate semitransparent metallic electrode layer spaced from the metallic bottom-electrode layer. The material for the semitransparent metallic electrode layer includes Ag, Au, or alloys thereof The thickness of the semitransparent metallic electrode layer, the combined thickness of the organic layers and the transparent conductive phase-layer, and also the placement of the light-emitting layer are selected so that each pixel in the display forms a tuned microcavity OLED device having emission output efficiency above that of a comparable OLED device without the microcavity. U.S. Pat. No. 5,949,187 by Xu et al. describes an OLED with a first microcavity including a first transparent spacer and a first mirror stack positioned on the first spacer to reflect light back into the OLED and to define an optical length of the first microcavity. The optical length of the first microcavity is such that light emitted from the first microcavity has a first spectrum. A second microcavity includes a second transparent spacer positioned adjacent the first microcavity and a second mirror stack positioned on the second spacer reflects light toward the second microcavity and defines an optical length of the second microcavity. The optical length of the second microcavity is such that light emitted from the second microcavity has a second spectrum. Additional microcavities can be placed in the structure to further enhance and alter the light spectrum. Such designs, however, can have increased manufacturing costs, lower light output than desired, and reflectance larger than may be desired, as well as significant color change at different viewing angles, owing to the change in the effective optical path length for light traveling at angles to the normal.

US Patent Publication No. 2006/0066228 entitled, "REDUCING OR ELIMINATING COLOR CHANGE FOR MICROCAVITY OLED DEVICES" by Antoniadis et al. discloses a microcavity OLED device that reduces or eliminates color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again such designs can have increased manufacturing costs due to patterned deposition processes. Also, significant light can be absorbed by the color filters thereby reducing efficiency.

One approach to overcoming material deposition problems on large substrates is to employ a single emissive layer, for example, a white-light emitter, together with color filters for forming a full-color display, as is taught in U.S. Pat. No. 6,987,355 entitled, "STACKED OLED DISPLAY HAVING IMPROVED EFFICIENCY" by Cok. However, the use of color filters substantially reduces the efficiency of the device. It is also known to employ a white sub-pixel that does not include a color filter, for example as taught in U.S. Pat. No. 6,919,681 entitled, "COLOR OLED DISPLAY WITH IMPROVED POWER EFFICIENCY" by Cok et al. However, this disclosure does not address angular color issues or the large amount of trapped light.

A microcavity OLED device can also produce white-light emission. U.S. Pat. No. 7,268,485 entitled, "WHITE-EMITTING MICROCAVITY OLED DEVICE" by Tyan et al. describes a white-light emitting OLED apparatus including a microcavity OLED device and a light-integrating element, wherein the microcavity OLED device has a white-light emitting organic EL element and the microcavity OLED device is configured to have angular-dependent narrow-band emission, and the light-integrating element integrates the angular-dependent narrow-band emission from different angles from the microcavity OLED device to form white-light emission. However, this can reduce the color gamut of the device. U.S. Pat. No. 7,030,553 entitled, "OLED DEVICE HAVING MICROCAVITY GAMUT SUB-PIXELS AND A WITHIN GAMUT SUB-PIXEL" by Winters et al. discloses an example of a microcavity device. This disclosure describes an OLED device including an array of light-emitting pixels, each pixel including sub-pixels having organic layers including at least one emissive layer that produces light and spaced electrodes. There are at least three gamut sub-pixels that produce colors that define a color gamut and at least one sub-pixel that produces light within the color gamut produced by the gamut sub-pixels. At least one of the gamut sub-pixels includes a reflector and a semitransparent reflector, which function to form a microcavity. However, this design employs a patterned semi-transparent electrode to form the white sub-pixel that can be difficult to manufacture in a top-emitting format. Moreover, angular color change is not addressed in the patent.

There still remains a need, therefore, for an improved light-emitting structure that overcomes shortcomings in the prior art and that improves the angular color performance of an LED device.

SUMMARY OF THE INVENTION

In accordance with the present invention, there is provided a light-emitting diode device, comprising:
a) a substrate; and
b) a light-emitting element having two or more commonly-controlled portions, the light-emitting element having two electrodes and a common unpatterned white-light-emitting layer formed between the two electrodes, at least one portion having an optical spacer, each portion having a different optical structure, the optical structure in one portion being tuned to emit substantially white light and that one portion having a transparent electrode, and the optical structure in a different portion being tuned to emit colored light.

ADVANTAGES

The present invention has the advantage that it improves the angular color performance of an LED device. LED devices in accordance with the present invention have improved color stability when viewed from a variety of angles since the spectrum of the combined light emitted from the portions is more stable than the spectrum of the light emitted from individual portions.

BRIEF DESCRIPTION OF THE DRAWINGS

FIG. 9 is a prior-art illustration of a micro-cavity LED device.

It will be understood that the figures are not to scale since the individual layers are too thin and the thickness differences of various layers too great to permit depiction to scale.

DETAILED DESCRIPTION OF THE INVENTION

Figure 1:
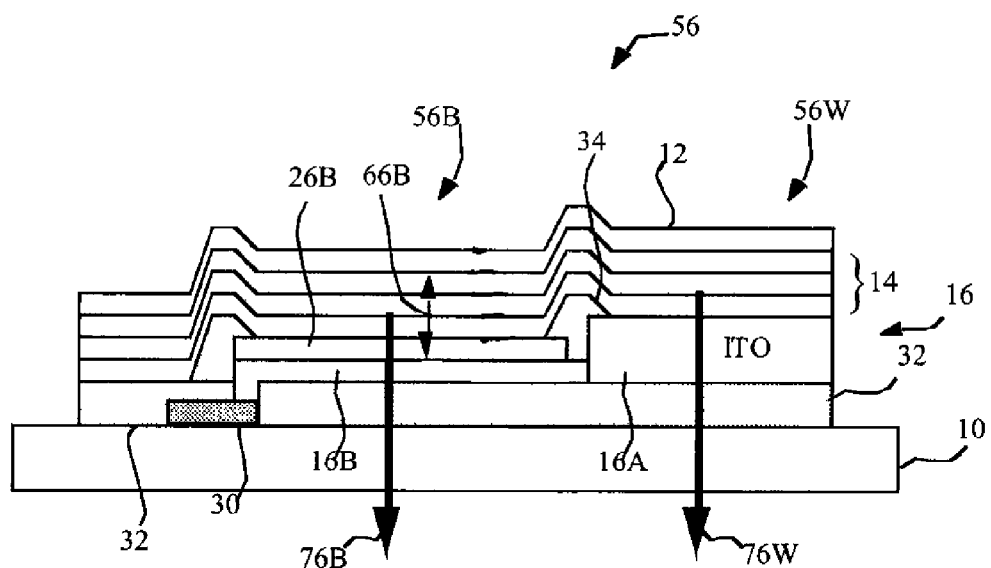
FIG. 1 illustrates a partial cross-section of a bottom-emitter LED device according to an embodiment of the present invention.

Referring to FIG. 1, an exemplary embodiment of a light-emitting diode device according to the present invention comprises a substrate 10 on which is formed a light-emitting element 56 having two or more commonly controlled portions 56B, 56W, the light-emitting element 56 having two electrodes 12, 16 and a common unpatterned white-tight-emitting layer(s) 14 formed between the two electrodes 12, 16, at least one portion having an optical spacer 26B forming an optical cavity 66B. Each portion 56B, 56W has a different optical structure, the optical structure in one portion being tuned to emit substantially white light 76W and that one portion having a transparent electrode, and the optical structure in a different portion being tuned to emit colored light 76B. The electrodes in all of the portions 56B, 56W are commonly controlled to form the light-emitting element 56 and the electrode 16A in at least one portion 56W comprises a transparent conductor.

In further embodiments of the present invention, an electrode in at least one portion 56 is a semi-transparent electrode 166B, for example comprising silver. Typically, the electrode in one portion (e.g. 16A) has a different optical characteristic than the electrode in one other portion (e.g. 16B) so that electrode 16A differs optically from electrode 16B. Optical characteristics are the attributes of a layer that define the layer's behavior with respect to interactions between the layer and electromagnetic radiation, including transparency, reflectivity, absorption, and optical index. In an embodiment of the present invention, the electrode 12 in at least one portion is reflective. In one common embodiment of the present invention, the electrode 12 is reflective in all portions 56B, 56W.

In an embodiment of the present invention, the optical structure of one portion (e.g. 56W) is tuned to emit substantially white light and employs a reflective electrode 12 and transparent electrode 16A. Because electrode 16A is transparent (i.e. has a reflectance less than 15% and a transmittance greater than 70%, preferably greater than 80%, and more preferably greater than 90% at at least some frequencies), electrode 16A does not form a conventional microcavity (i.e. electrode 16A is not semi-transparent). However, because the various layers making up the light-emitting diode device have different indices of refraction, some optical interference occurs and the layer thicknesses can be chosen to optimize features such as the light output or color for the portion 56W. According to the present invention, the layers in portion 56W are selected to emit substantially white light. "Substantially white light" is defined herein as light that is closer to a target white point in a color space such as CIE x, y or CIE u', v' (e.g. D65) at a normal to the substrate 10 than light emitted by the other portions of the light-emitting diode (e.g. 56B). Consequently, colored light emitted by other portions (e.g. 56B) is farther from a target white point (e.g. D65) at a normal to the substrate 10 than the white-light emitting portions of the light-emitting diode (e.g. 56W). Typically, the actual white color is a distance in color space of less than 0.1 from the target white point or from the Planckian locus. Preferably, the actual white color is less than 0.05 from the desired point and even more preferably less than 0.025 from the target white point. However, as discussed further below, this can be difficult to achieve, particularly for complex light-emitting diode layer structures and at a wide variety of viewing angles. Indeed, it is possible, at some viewing angles other than the substrate normal, for light emitted by the colored emitters to be closer to the target white point than the white-light emitters. However, at a normal angle, the white emitters must be closer to the desired white point or the Planckian locus than the colored emitters as illustrated below.

Optical spacers (e.g. 26B) can be a separate layer (as shown in FIG. 1) or be implicit in the different thicknesses of different materials forming the electrodes (e.g. 16A and 16B). The optical spacer layer can be an organic or an inorganic, transparent conductive layer in electrical contact with either the first or second electrode. In any case, according to the present invention, the optical structure of the different cavities must differ to provide differing optical behavior that has an improved combined performance within a light-emitting element 56.

The different portions of the light-emitting element 56 are driven in common, that is any voltage differential applied to one portion through electrodes 12, 16 is likewise applied to all portions. As shown in FIG. 1, for example, the electrode elements 16B and 16A are electrically connected. Conventional materials can be employed to form the electrodes, for example Al, Ag, Mg or various alloys can be used to form a reflective electrode (e.g. 12) while metal oxides, such as ITO or AZO can be used to form a transparent electrode (e.g. 16A). Thin layers of metal, e.g. 5-50 nm of Ag, can be used to form semi-transparent electrodes (e.g. 16B). The reflective and transparent/semi-transparent electrodes 12, 16A, 161B can be configured to form either a top- or bottom-emitting LED device. For example, the electrode 12 can be reflective and can be formed between the substrate 10 and the electrode 16A, 16B or the electrode 12 can be reflective and the electrode 16A, 16B can be formed between the substrate 10 and the electrode 12 (as in FIG. 1). In the first case, a top-emitting device is formed and, in the second case, a bottom-emitting device is formed.

Figure 6:
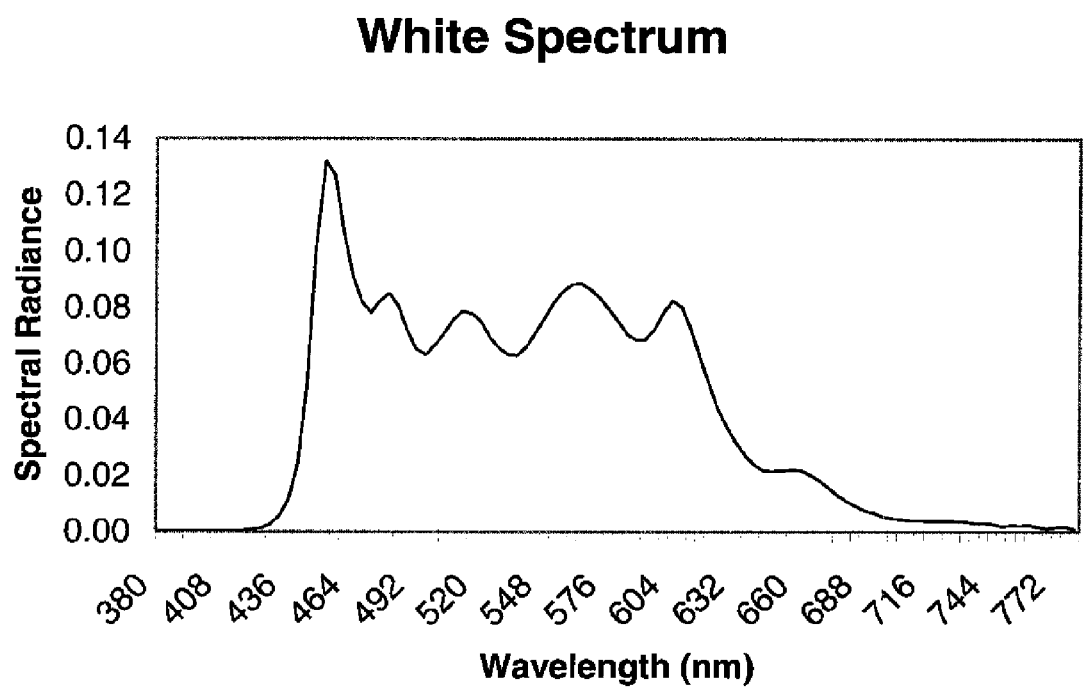
FIG. 6 is a graph illustrating the spectrum of a white emitter at a normal viewing angle without a microcavity structure useful in various embodiments of the present invention.

The common unpatterned white-light-emitting layer(s) 14 formed between the electrode 12, and electrode 16A, 16B has the same materials and deposition thicknesses in all of the portions within a light-emitting element (e.g. portions 56B and 56W in light-emitting element 56). Hence, the differing optical characteristics of the portions are not derived from different light-emitting layers. The common unpatterned white-light-emitting layer(s) 14 can include multiple organic or inorganic layers, including multiple light-emitting layers. For example, FIG. 6 illustrates the spectrum of a white-light-emitting OLED device that has been made and that includes multiple light-emitting layers. These multiple light-emitting layers are largely responsible for the various peaks found in the spectrum. The spectrum of the white light includes peaks that can be matched to the resonant frequencies of one or more of the optical structures, for example having frequencies within 50 nm and preferably within 25 nm, thus enhancing the output of the device at those frequencies.

Figure 2:
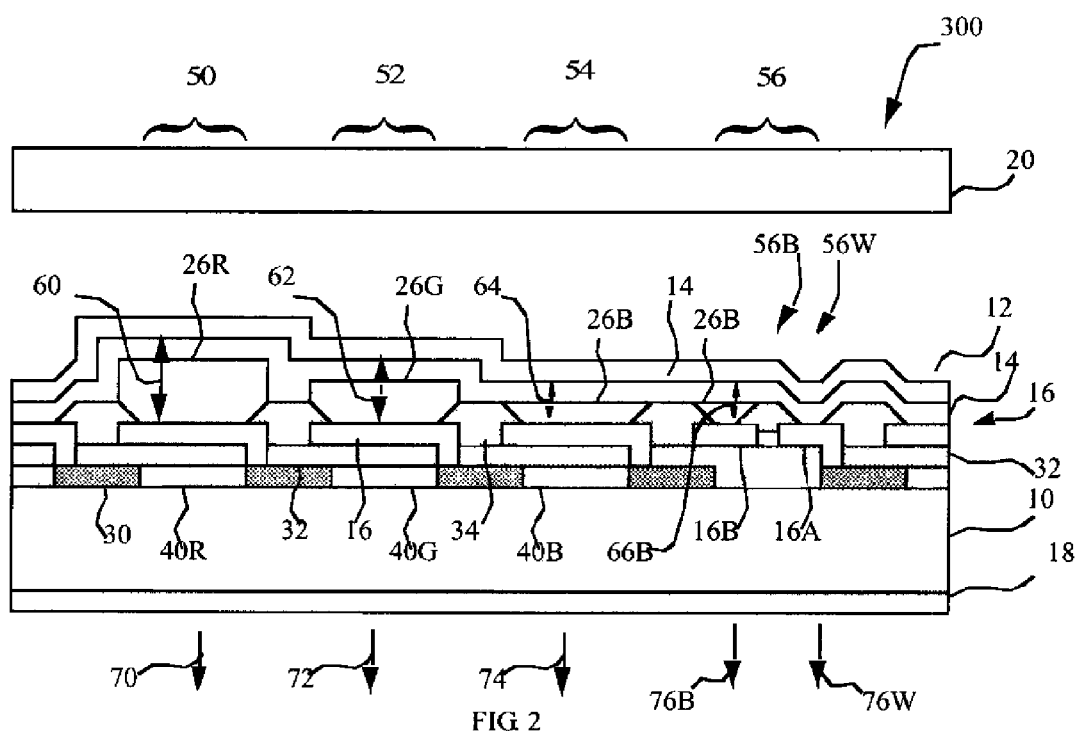
FIG. 2 illustrates a partial cross-section of a bottom-emitter LED device having color light-emitting elements according to another embodiment of the present invention.

Referring to FIG. 2, in another embodiment of the present invention, the light-emitting diode device 300 can further comprise red, green, and blue independently-controlled light-emitting elements 50, 52, 54, each of the red, green, and blue light-emitting elements 50, 52, 54 having an electrode 12 and an independently controlled electrode 16 with the common unpatterned white-light-emitting layer(s) 14 formed between the electrode 12 and independently controlled electrode 16, the electrode 12 and independently controlled electrode 16 and the common unpatterned white-light-emitting layer(s) 14 of the red, green, or blue light-emitting elements 50, 52, 54 forming optical structures 60, 62, 64 tuned (through the use of optical spacers 26R, 26G, 26B) to red, green, or blue respectively. To improve manufacturing efficiency, at least one of the red, green, or blue optical spacers 26R, 26G, 26B can have the same composition and thickness as the optical spacer in one of the optical structures of at least one of the portions (e.g. 56B, 56W). In the specific embodiment shown in FIG. 2, the optical spacer 26B in the blue light-emitting element 54 is identical to (i.e., has the same composition and thickness as) the optical spacer found in the portion 56B; however, in other embodiments of the present invention, the optical spacer in portion 56W or the optical spacer 26B in portion 56B can be the same as an optical spacer in any of the colored light-emitting elements 50, 52, 54. Moreover, portion 56W can include an optical spacer that can be the same as the optical spacer in portion 56B if the optical cavity structures in the portions 56B, 56W are different, for example by employing different materials in the electrode 16A, 16B or other cavity layers.

Moreover, in a further embodiment of the present invention, the electrode 12 and independently controlled electrode 16 of at least one of the red, green, or blue independently-controlled light-emitting elements 50, 52, 54 is semi-transparent and can comprise, for example a thin (5-50 nm) silver layer so that the optical structures are microcavities. Such a thin metal layer can form a microcavity structure and thereby increase the color saturation and normal emission of the light-emitting element. In a further embodiment of manufacturing simplicity, at least one of the electrodes is common to all of the independently controlled light-emitting elements, as is shown in FIG. 2 with electrode 12. According to an embodiment of the present invention, white-light emitting layer(s) 14 can be common to all of the light-emitting elements 50, 52, 54, 56 in the light-emitting diode device 300. However, experiments have shown that, even with the use of microcavity structures in the colored light-emitting elements, the use of a white-light-emitting layer(s) 14 produces insufficient color saturation to provide satisfactory color for some device applications. Hence, in further embodiments of the present invention, color filters 40R, 40G, 40B can be employed to improve the color saturation of the color light-emitting elements 50, 52, 54. Such color filters need not be used in the light-emitting element 56 so that no light is absorbed by a color filter and the efficiency of light output is maintained. Hence, such a configuration forms a red, green, blue, and white sub-pixel arrangement and, when used in a display device, forms an RGBW pixel structure with a common white-light emitting layer in all of the red, green, blue, and white light-emitting elements. To optimize the performance of the RGBW system, at least one of the red, green, or blue independently-controlled light-emitting elements 50, 52, 54 includes color filters having a transmission peak matched to the resonant frequency of the corresponding optical structure. In order to customize the optical cavity or layer structure of each of the light-emitting elements, an optical spacer layer can be formed between the electrode 12 and independently controlled electrode 16 of the red, green, or blue independently-controlled light-emitting elements 50, 52, 54. As was noted above, one or more of these spacer layers can have the same composition and thickness as a spacer layer found in any portion of light-emitting element 56.

Figure 3:
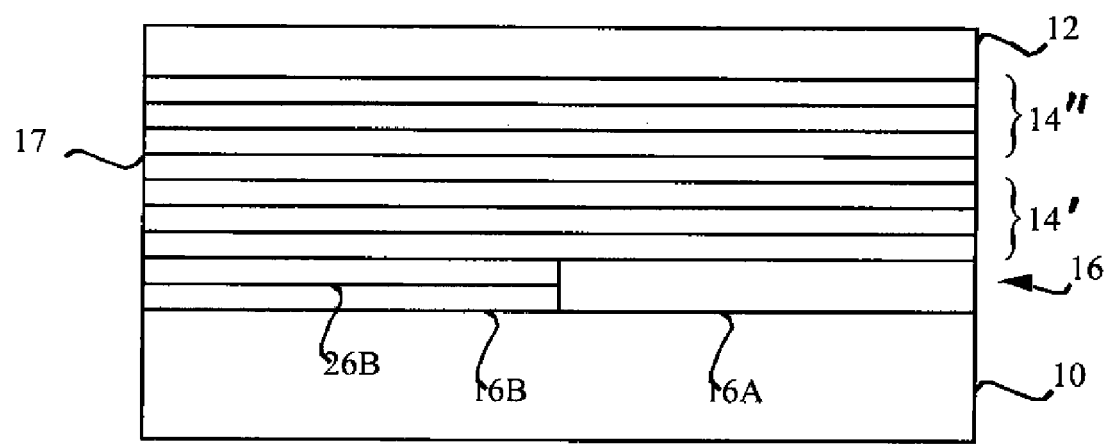
FIG. 3 illustrates a partial cross-section of a stack of light-emitting diodes useful in an embodiment of the present invention.

It has been found through experimentation that the angular change in color of a white-light-emitting layer can be unacceptable for some applications. This has been found to be particularly true for multi-light-emitting-diode ("tandem") structures such as that illustrated in FIG. 3. Referring to FIG. 3, a substrate 10 has an electrode 16, possibly comprising separate electrode conductors 16A and 16B and spacer 26B. Formed over the entire electrode 16 are one or more first organic or inorganic layers 14', at least one of which is light-emitting, an electrode or electrical connector 17, and second organic or inorganic layers 14". On top of the second organic or inorganic layers 14", is located a first electrode 12. Upon the application of a sufficient voltage differential between the electrode 12 and electrode 16A, 16B, current flows through both light-emitting layers 14', 14" to emit light. The electrode or electrical connector 17 can comprise an inorganic or organic transparent conductive layer or layers that serve to separate the two light-emitting layers 14', 14". Such "tandem" light-emitting structures and materials are known in the art and increase the lifetime of the light-emitting materials by reducing current density in the layers at the cost of an increased voltage differential.

Figure 4:
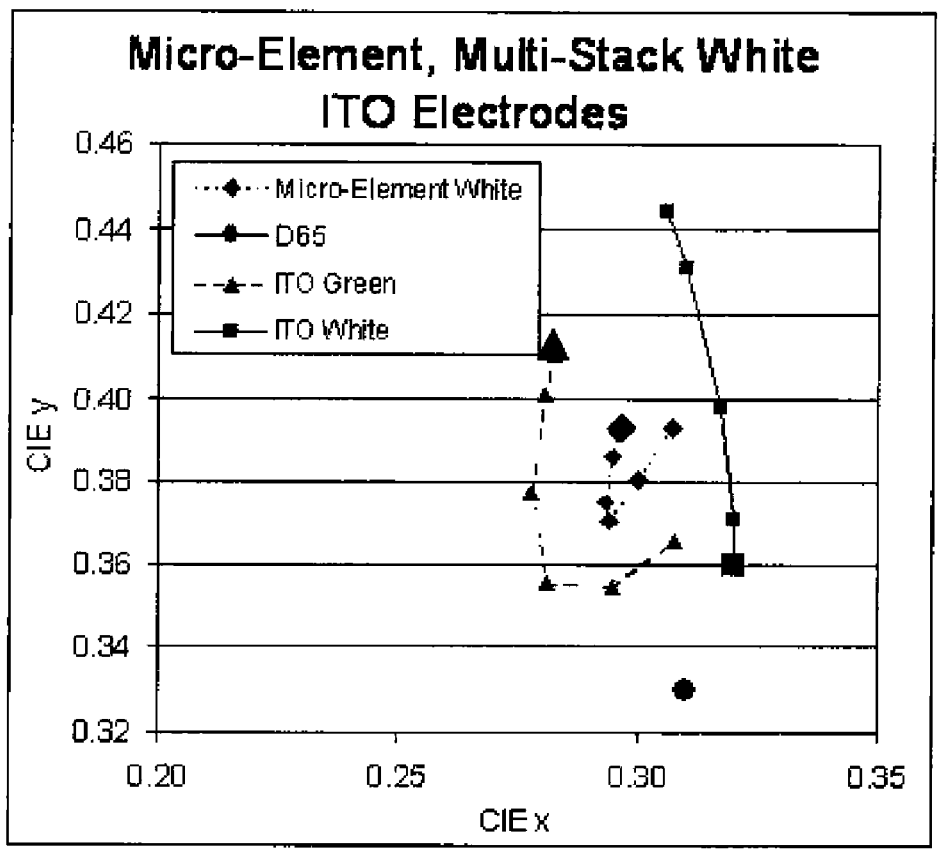
FIG. 4 is a graph illustrating the change in color of light emitted from various portions employing ITO electrodes and a combination of the light emitted from the portions according to an embodiment of the present invention.

Referring to FIG. 4, the change in color of the two-diode stack shown in FIG. 3 is graphed as "ITO White" in terms of the CIE x and y coordinates for angles from 0 degrees to 70 degrees from the substrate normal. As can be seen in this graph, the color change in the CIE y direction (from about 0.36 to more than 0.44) is substantial and unlikely to be acceptable in many applications. According to the present invention, by combining the light output from an additional portion in the unfiltered light-emitting element, the change in color with angle can be reduced. Referring to FIG. 4, a second portion having an ITO second electrode and layer thicknesses tuned to enhance green light provides the light output shown as "ITO Green". (This is the same layer thickness used to produce the green microcavity when an additional semi-transparent electrode is added to produce the green sub-pixel 52 in FIG. 2. Employing the same thickness for two sub-pixels reduces manufacturing costs.) The combined light emission of these two portions is shown as "Micro-Element White." The largest marked point in each curve is the CIE coordinate for the emitter at 0 degrees, while the other marked points represent viewing angles of 15, 30, 45, 60, and 70 degrees. It is clear from the graph, that the change in CIE color coordinates with viewing angle of the combined light emitted from all of the portions is less than the change in CIE color coordinates with viewing angle of the light from each of the portions. Moreover, while the on-axis color of the light emitted from the "ITO White" portion is closer to the desired white point D65, at higher angles the color of the combined "Micro-Element White" light is closer to the desired white point D65. Hence, the CIE color coordinates of the combined light from all of the portions is closer to a target white point than the CIE color coordinates of the light from at least one of the portions at at least one viewing angle.

While the example of FIG. 4 uses layer thicknesses in the additional portion 56B chosen to match the desired green light-emitting element 52, other layer thicknesses can be employed, for example to emit light tuned to red, blue, cyan, magenta, or yellow. More than one portion can be used. Moreover, the different portions in the light-emitting element 56 need not have the same size. As illustrated in FIG. 1, electrode 166B has a greater area than electrode 16A so that the area of light-emitter 56B will be larger than the area of light-emitter 56W. The relative area sizes of the portions can be chosen to reduce the change in color of the combined light with angle, difference in color of the combined light from a target white point, or a change in color of the combined light weighted by angle. In FIG. 4, the relative areas of the "ITO Green" and the "ITO White" portions are in a ratio of approximately 65 to 35 to produce the "Micro-Element White" result.

Figure 5:
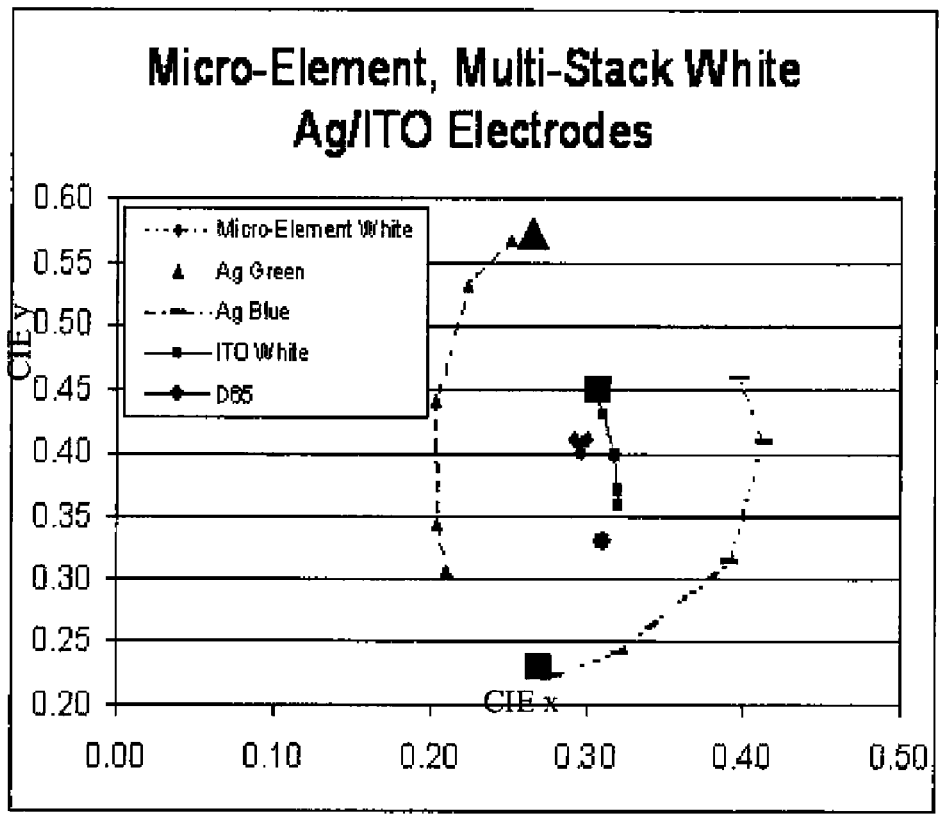
FIG. 5 is a graph illustrating the change in color of light emitted from various portions employing ITO and Ag electrodes and a combination of the light emitted from the portions according to an embodiment of the present invention.

In a second example illustrated in FIG. 5, colored light emitted by second and third portions having thin silver, semi-transparent electrodes are combined with the white light emitted through an ITO electrode. In this case, the "ITO White" is identical to the example of FIG. 4. However, the "Ag Green" and "Ag Blue" employ thin metal semi-transparent electrodes forming optical microcavities that are matched to the green and blue optical microcavities illustrated in FIG. 2. The color of the combined "Micro-Element White" light in an approximate ratio of 32 "Ag Green," 10 "Ag Blue," and 58 "ITO White" is very stable with respect to angle.

To further understand this invention, it is useful to understand a number of the terms that are employed. A reflective thin-film structure will typically reflect at least 50% of the radiant energy for at least one desired wavelength and preferably reflect at least 80% of the radiant energy for at least one desired wavelength. However, it will be recognized that it is desirable for such a reflective thin-film structure to reflect even greater than 90% of the radiant energy. Such a reflective film will also typically transmit less than 10% (vith the remainder that is neither transmitted nor reflected being absorbed by the film).

A semi-transparent conductive film of the present invention is desired, which has low absorbance within a desired wavelength range. Such a semitransparent film (which can be made up of multiple layers) will typically reflect at least 15% of the radiant energy that impinges on it and preferably reflects significantly more of the radiant energy that impinges upon it over a desired wavelength range. It will also typically transmit greater than 10% of the radiant energy. An example of such a semi-transparent film is 5 to 50 nm of Ag; often a high-index film such as an organic material or ITO will be coated on top of the Ag at an appropriate thickness to serve as what is sometimes called an "absorption reduction layer."

Finally, a transparent film will have a reflectance of less than 15% and a transmittance of greater than 70%, more preferably greater than 80%, and most preferably greater than 90% for at least one desired wavelength. An example of such a thin film is ITO.

When discussing a range of angles, such angles are typically measured with respect to a vector drawn normal to the substrate, which will often also be normal to the active region of the reflective conductive thin-film structure.

Further, within this disclosure, the term white can refer to any color to which a human observer can adapt to and perceive as white. Such colors are often specified with respect to the Planckian Locus within a perceptually relevant color space, such as the 1976 CIE uniform chromaticity diagram. A color is often considered perceptually white if it lies within 0.05 units of the Planckian Locus for blackbody temperatures between 3000 and 20,000 Kelvin when plotted within the 1976 CIE uniform chromaticity diagram. However, it is sometimes desirable for various reasons to use a white emission layer to emit light that does not meet this criterion of perceptual whiteness, in which case the methods of the present invention can be used to form a white subpixel with a desired white point that is within, or closer to, the perceptually white region of the color space.

The independently-controllable light-emitting elements can be controlled, for example, by thin-film electronic components 30 formed on the substrate 10 and insulated from other thin-film layers by, for example, planarizing or insulating layers 32, 34 (see FIG. 2). One electrode 12 can be unpatterned and electrically common to all of the light-emitting elements 50 52, 54, and 56. An unpatterned white-light-emitting layer(s) 14 is formed between the reflective electrode 12 and the transparent or semi-transparent conductive electrode 16 and can include several layers, for example, charge-control layers as are known in the prior art. At least a portion 16A of the electrode 16 of light-emitting element 56 is transparent. Another portion 16B may have a semi-transparent electrode so that, together with the electrode 12 and unpatterned white-light-emitting layer(s) 14, a microcavity 66B is formed. Other light-emitting elements (e.g. 50, 52, 54) may also have a semi-transparent electrode likewise forming microcavities (e.g. 60, 62, 64). The reflective conductive thin-film structure 12, transparent conductive thin-film structure 16A, and unpatterned white-light-emitting layer(s) 14 also form an optical structure tuned to emit white light. Several color filters 40R, 40G, and 40B are formed over a side of the electrode 16 opposite the unpatterned white-light-emitting layer(s) 14 in correspondence with the independently-controllable light-emitting elements 50, 52, 54 to form colored sub-pixels. At least one independently controllable light-emitting element 56 has at least two commonly-controlled portions 56B, 56W. The commonly controlled portions 56B, 56W of the white light-emitting element 56 includes a plurality of optical structures. Each optical structure is tuned to emit light at a different wavelength at a range of emission angles. In accordance with at least one embodiment of the present invention, the color change of the combined light emitted by the commonly controlled portions at a range of angles is less than the color change of the light emitted by at least one of the microcavity structures over the range of angles.

The present invention can be employed in an RGBW (red, green, blue, and white) sub-pixel architecture to form individual pixels in an information presentation device, such as a display. A common, unpatterned white-light emitter(s) 14 is employed. Colored light is formed by a combination of separately tuned microcavities for each color together with color filters 40R, 40G, 40B (for the color sub-pixels). A black matrix can be employed to absorb ambient light between the light-emitting elements 50, 52, 54, 56. Planarizing and insulating layers 32 and 34 can be provided to electrically separate the independently controllable light-emitting elements. A color filter may not be necessary for all of the sub-pixels.

Figure 7:
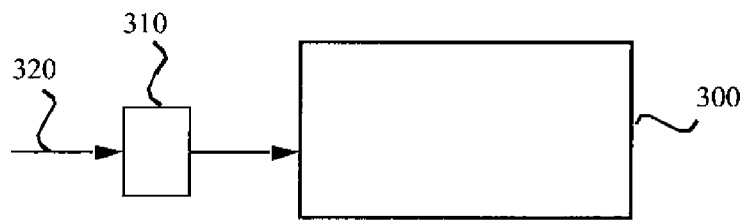
FIG. 7 is a system diagram employing an embodiment of the present invention.

Alternatively, the present invention can be employed to form an area illumination device or lamp. In this latter case, emission at a wide variety of frequencies is necessary to provide a high color-rendering index (CRI). Hence, employing complementary optical cavity structure pairs having a widely distributed set of frequencies can provide a high-quality white-light source. Referring to FIG. 7, such displays, area illuminators, or lamps can be employed in a light-emission system that includes an LED device 300, together with a controller 310 to control and provide power to the thin-film, light-emitting diode device; typically through the reflective, conductive thin-film electrode 12 and electrode 16, which are typically current-carrying electrodes, in response to an information or power signal 320.

Prior art light-emitting solutions employing thin-film optical cavity structures suffer from a poor white emission and, in particular, a strong tendency to change color when viewed at different angles. As taught in the present invention, however, the commonly controlled portions 56 emit light that has a smaller spectral range than the spectral range of the white-light-emitting thin-film layer(s) 14 in a single portion alone. Therefore, the present invention provides thin-film optical cavity structures that produce light with a decreased dependence on angle.

According to various embodiments of the present invention, the commonly controlled portions are not individually distinguished by the human eye when viewed from a typical viewing distance, for example the commonly-controllable portions 56B, 56W of the light-emitting element 56. Hence, the light emitted from the light-emitting element 56 will be viewed as a single color light-emitting element, even though the light emitted from the light-emitting element 56 is actually a combination of complementary colors.

In operation, current, for example, as supplied through thin-film transistors 30 as shown in FIG. 2, passes through the light-emitting layer(s) 14 via the thin-film, conductive structures (electrodes) 12 and 16, causing light to be emitted. Some of the emitted light passes directly out of the device or through the color filters and out of the device. Other light is reflected from the reflective electrode 12 and passes out of the device. Other light, emitted at a higher angle to the normal, is trapped via total internal reflection. The optical cavity structures serve to reduce the angle of emission of the emitted light, thereby focusing more of the desired light in the forward direction. Commonly-controllable portions 56W and 56B of a light-emitting element 56 are driven at the same time with the same electrical controls (e.g. transistors 30) so that they cannot be independently stimulated and, hence represent one sub-pixel, albeit one having different optical components.

The present invention can be employed with both active-matrix and passive-matrix control circuits. It should be noted that the relative sizes of the microcavity structures 56W and 56B of light-emitting element 56 can be adjusted during design and manufacturing, at least in some embodiments, to tune the relative luminance, color, and angular performance of light emission.

A large variety of white-light-emitting materials and layer structures can be employed in concert with the present invention, together with a wide selection of optical cavity sizes, both for the colored sub-pixels 50, 52, 54, and the optical structures 66B, 66W of the white sub-pixel, light-emitting element 56.

A variety of light-emissive materials are employed in the present invention. For example, the white-light-emitting layer can include organic materials such as small-molecule organic or polymer materials or inorganic quantum dots formed in a poly-crystalline semiconductor matrix. Conventional photolithographic techniques can be employed to form control structures (e.g. busses, transistors, capacitors, electrodes) on a substrate as well as forming transparent layers suitable for defining optical cavities. Suitable cavity-defining transparent materials can include, for example, silicon dioxide or indium tin oxide. Organic materials are deposited by various means known in the art, for example, vacuum evaporation. However, such means must provide sufficient precision and accuracy to enable the consistent manufacturing of the optical cavities. In particular, the Kodak Vapor Injection Sourse Technology™ is a linear, organic vacuum evaporation source providing deposition of organic layers to within 1% uniformity and accuracy that can be usefully employed. Suitable semi-transparent cathodes can be formed by evaporation or sputter techniques known in the art, for example of silver, magnesium, aluminum, or other metals or metal alloys. These semi-transparent electrodes will typically have a reflectance of greater than 15% and will typically have an absorbance of less than 20% and more ideally less than 10%. To aid in obtaining the desired reflection with low absorption, high-refractive-index capping layers (which are sometimes referred to as "absorption reduction layers") of organic or inorganic materials with thickness tuned to produce the desired properties can be used on the side of the metal or metal alloy opposite the emitting layers. Encapsulation techniques for both organic and inorganic materials useful for the present invention are known in the art. The present invention can be employed with various elements, such as circular polarizers (18 in FIG. 2), suitable for improving device ambient contrast ratio. In one embodiment, the present invention is a top-emitter device. In an alternative embodiment, (FIG. 2) the device is a bottom-emitter device.

Figure 8:
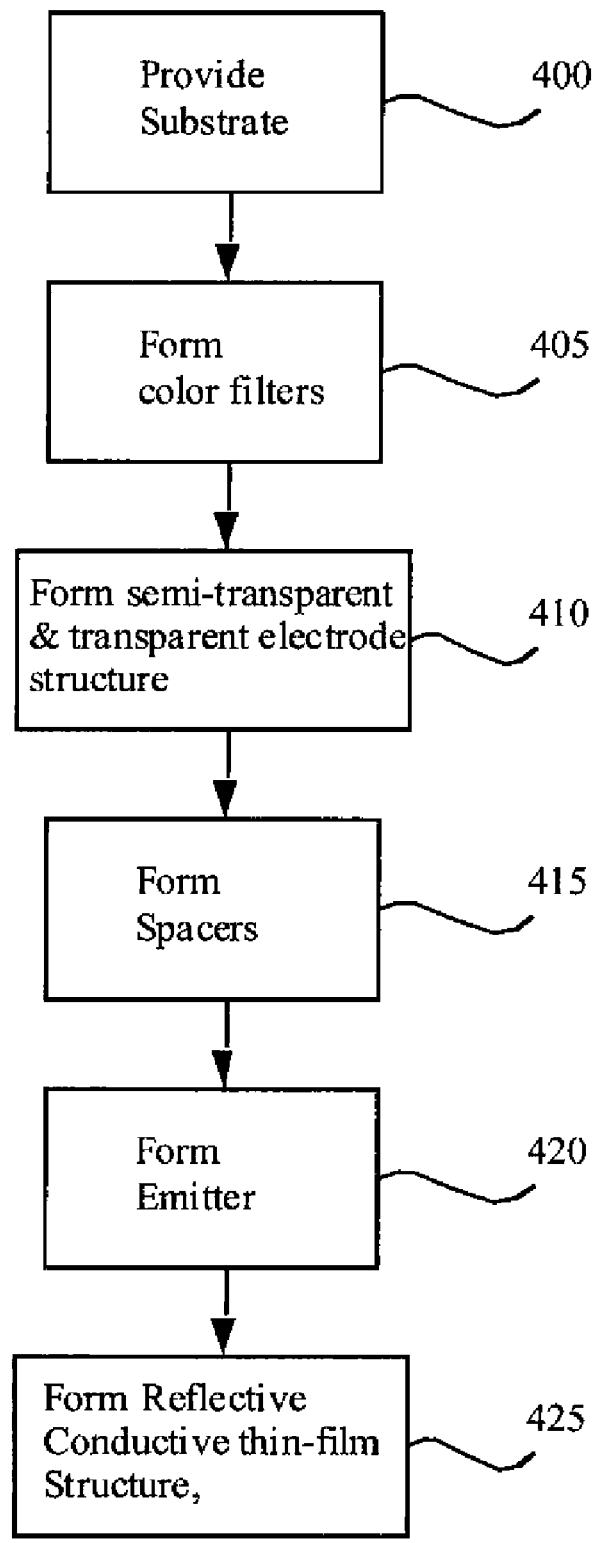
FIG. 8 is a flow chart illustrating a method of making a device according to an embodiment of the present invention.

Referring to FIG. 8, according to the present invention, a method of making an LED device includes: step 400 providing a substrate; step 405 forming color filters over the substrate; step 410 forming a patterned transparent and semi-transparent thin-film electrode structure, step 415 forming spacers; step 420 forming an unpatterned white-light-emitting layer over the transparent and semi-transparent electrode structure; and step 425 forming a reflective, conductive thin-film electrode structure over the unpatterned white-light-emitting layer. Either the reflective or semi-transparent conductive thin-film structure is patterned to form a plurality of independently controllable light-emitting sub-pixel elements. At least one independently controllable light-emitting element has at least two commonly-controlled optical cavity structures that together emit light to form a light-emitting element. In an alternative method of the present invention, the steps 410 and 425 are reversed to form a top-emitting structure.

In a patterned device, different materials are employed to emit light of different colors in response to current. In contrast, in an unpatterned device, the same materials are employed to emit a single color, for example, white, and the light emitted by the color sub-pixels is colored by employing color filters or microcavity structures in combination with the white-light emitter. Often, a white-light emitter will include a combination of materials in one or more unpatterned layers that each emit a different color, for example, blue and yellow or red and cyan, to emit a light that is perceived, overall, to be white. The important point is that the layers can be unpatterned within one portion of a light-emitting element.

It is known in the prior art that, in LED devices, light can be trapped by total internal reflection in the high-optical-index layers that actually emit light, or high-optical index charge-control layers, or high-optical index transparent electrodes. Light emitted at low angles to the normal can be emitted from the device, while light emitted at a relatively higher angle to the normal can be trapped in the high-optical-index layers. By employing an optical cavity structure, the emission of light at high angles is reduced so that more light is emitted from the device at relatively lower angles to the normal.

However, the reduction in color shift found with increasing angle for the color sub-pixels provided by the present invention (e.g. FIG. 2) is often accompanied by a reduction in luminance with angle of these color sub-pixels. Such a reduction in luminance is less noticeable and objectionable to viewers than a shift in color. Moreover, to the extent that the color sub-pixels decrease in luminance, while the luminance of the white sub-pixels is constant (although a white-point shift can occur) as a result of changing viewing angle, the net effect can be a reduction in overall color saturation for those colors produced from a combination of white and colored subpixels. Such a color saturation reduction is negligible for some images (i.e. those images with little saturated color) and less noticeable than a change in color for those images with more strongly saturated colors. Hence, improved image quality is obtained. Moreover, since most images are relatively unsaturated, the net luminance effect is often relatively minor.

Numerous OLED devices employing microcavities have been constructed, both with patterned, colored emitters and with white emitters and their performance studied together with the performance of circular polarizers and color filters. Moreover, optical modeling tools have been employed to understand the performance of the present invention under a variety of circumstances. In general, a white-light-emitting, unpatterned OLED device employing an optical microcavity and color filters can be expected to roughly double the light output of the colored pixels in comparison to a white-light-emitting, unpatterned OLED device without an optical microcavity and with color filters. The color sub-pixels will increase in light output the most, while the white-light-emitting sub-pixel will only change in light output by a multiplicative factor of roughly 0.6 to 1.2, since it is more difficult to increase broadband light output than narrow-band light in an optical cavity structure. However, since the white-light-emitting sub-pixel is more efficient (by about a factor of three) than the color sub-pixels (since no color filters are employed in the white sub-pixel), the use of a white sub-pixel still improves the overall performance of an OLED device as most images have few saturated colors and the more-efficient white-light emitter is used disproportionately. The use of such a white sub-pixel in a color filter design has been demonstrated to improve the overall device performance by a factor of approximately two to four for some imaging applications.

LED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings can be specifically provided over or as part of the cover or substrate.

The present invention can be practiced with either active- or passive-matrix OLED devices, and is particularly useful in information-display devices. In one embodiment, the present invention is employed in a flat-panel OLED device composed of small-molecule or polymeric OLEDs as disclosed in, but not limited to, U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top-emitter or a bottom-emitter architecture.

The invention has been described in detail with particular reference to certain preferred embodiments thereof, but it will be understood that variations and modifications can be effected within the spirit and scope of the invention.

PARTS LIST 10 substrate
12 reflective electrode
14, 14', 14" light-emitting layer(s)
16 transparent or semi-transparent independently controlled electrode
16B semi-transparent electrode
16A transparent electrode
17 electrode or electrical connector
18 circular polarizer
20 cover
26R, 26G, 26B, optical spacer
30 thin-film circuitry
32 insulator and planarization layer
34 insulator
40R, 40G, 40B color filter
50, 52, 54, 56 light-emitting elements, sub-pixels
56B, 56W portion
60, 62, 64, 66B optical cavity structures
70, 72, 74, 76B colored light
76W white light
300 device
310 controller
320 signal 400 provide substrate step
405 form color filters step
410 form electrode step
415 form spacer step
420 form emitter step
425 form reflective electrode step

The invention claimed is:

1. A light-emitting diode device, comprising:
a) a substrate; and
b) a light-emitting element having two or more commonly-controlled portions, the light-emitting element having two electrodes and a common unpatterned white-light-emitting layer formed between the two electrodes, at least one portion having an optical spacer and being tuned to emit colored light, each portion having a different optical structure, the optical structure in another portion being tuned to emit substantially white light and that one portion having a transparent electrode and having no optical spacer.

2. The light-emitting diode device of claim 1, wherein the portion emitting colored light has an electrode that is a semi-transparent electrode.

3. The light-emitting diode device of claim 2, wherein the semi-transparent electrode is a silver electrode.

4. The light-emitting diode device of claim 1, wherein an electrode in one portion has a different optical characteristic than an electrode in one other portion.

5. The light-emitting diode device of claim 1, wherein at least one electrode is reflective.

6. The light-emitting diode device of claim 1, wherein the spectrum of the white light includes peaks having frequencies matched to the resonant frequencies of one or more of the optical structures.

7. The light-emitting diode device of claim 1, wherein the change in CIE color coordinates with viewing angle of the combined light emitted from all of the portions is less than the change in CIE color coordinates with viewing angle of the light from each of the portions.

8. The light-emitting diode device of claim 1, wherein the CIE color coordinates of the combined light from all of the portions is closer to a target white point than the CIE color coordinates of the light from the other portions at a particular viewing angle or range of viewing angles.

9. The light-emitting diode device of claim 1, further comprising red, green, and blue independently-controlled light-emitting elements, each of the red, green, and blue light-emitting elements having two independently controlled electrodes with the common unpatterned white-light-emitting layer formed between two independently controlled electrodes, the two independently controlled electrodes and the common unpatterned white-light-emitting layer of the red, green, or blue light-emitting elements forming optical structures tuned to red, green, or blue respectively.

10. The light-emitting diode device of claim 9, wherein at least one of the red, green, or blue optical structures has the same optical cavity length as one of the optical structures of at least one of the portions.

11. The light-emitting diode device of claim 9, wherein one of the two independently controlled electrodes of at least one of the red, green, or blue light-emitting elements is semi-transparent.

12. The light-emitting diode device of claim 9, wherein at least one of the two independently controlled electrodes is common to all of the light-emitting elements.

13. The light-emitting diode device of claim 9, wherein at least one of the red, green, or blue light-emitting elements includes a color filter having a transmission peak matched to the resonant frequency of the corresponding optical structure.

14. The light-emitting diode device of claim 9, further comprising an optical spacer layer formed between the two independently controlled electrodes of the red, green, or blue light-emitting elements.

15. The light-emitting diode device of claim 1, wherein the optical structure of at least one portion is tuned to emit red, green, blue, cyan, magenta, or yellow light.

16. The light-emitting diode device of claim 1, wherein one of the two electrodes is reflective and is formed between the substrate and the other electrode or wherein the one electrode is reflective and the other electrode is formed between the substrate and the first electrode.

17. The light-emitting diode device of claim 1, wherein the optical spacer is an organic or an inorganic transparent conductive layer in electrical contact with either of the two electrodes.

18. The light-emitting diode device of claim 1, wherein the area of at least two of the portions is different.

19. The light-emitting diode device of claim 1, wherein the light emitting element comprises a stack of at least two light-emitting layers separated by an electrode or electrical connector.

* * * * *